United States Patent
Cennamo et al.

[11] Patent Number: 6,079,486
[45] Date of Patent: Jun. 27, 2000

[54] SPRING CLIP FOR ATTACHING AN ELECTRONIC COMPONENT TO A HEAT SINK AND AN ASSEMBLY UTILIZING THE SAME

[75] Inventors: John Cennamo, Gilford, N.H.; Keith T. Mandell, Rockwall, Tex.

[73] Assignee: Aavid Thermal Technologies, Inc., Laconia, N.H.

[21] Appl. No.: 09/031,002

[22] Filed: Feb. 26, 1998

Related U.S. Application Data

[60] Provisional application No. 60/039,179, Feb. 27, 1997.

[51] Int. Cl.[7] .................................................. F28F 7/00
[52] U.S. Cl. ........................ 165/80.3; 257/719; 361/707; 165/185
[58] Field of Search ................................. 165/80.3, 185; 257/719, 718; 361/707, 704, 709, 710

[56] References Cited

U.S. PATENT DOCUMENTS

| | | | |
|---|---|---|---|
| 1,368,869 | 2/1921 | Whiting . | |
| 1,797,091 | 3/1931 | Kapp et al. . | |
| 2,092,681 | 9/1937 | Reilly | 232/33 |
| 2,150,497 | 3/1939 | Fernberg | 24/259 |
| 2,713,469 | 7/1955 | Wright | 248/229 |
| 3,519,889 | 7/1970 | Monaco | 317/100 |
| 3,967,346 | 7/1976 | Young, Jr. | 24/73 B |
| 4,408,220 | 10/1983 | Calabro | 357/81 |
| 4,413,379 | 11/1983 | Evans | 24/3 J |
| 4,509,839 | 4/1985 | Lavochkin | 357/81 |
| 4,552,206 | 11/1985 | Johnson et al. | 165/80.3 |
| 4,710,852 | 12/1987 | Keen | 361/386 |
| 4,729,426 | 3/1988 | Hinshaw | 165/80.3 |
| 4,754,533 | 7/1988 | Awakowicz et al. | 24/458 |
| 4,933,746 | 6/1990 | King | 165/80.3 |
| 4,964,198 | 10/1990 | McCarthy | 24/458 |
| 5,040,096 | 8/1991 | Churchill et al. | 165/80.3 |
| 5,068,764 | 11/1991 | Bland et al. | 361/386 |
| 5,138,524 | 8/1992 | Smithers | 361/386 |
| 5,197,167 | 3/1993 | Marler | 24/296 |
| 5,331,507 | 7/1994 | Kyung et al. | 361/720 |
| 5,371,652 | 12/1994 | Clemens et al. | 361/704 |
| 5,615,735 | 4/1997 | Yoshida et al. | 165/80.3 |
| 5,784,254 | 7/1998 | Stephan et al. | 165/80.3 |

FOREIGN PATENT DOCUMENTS 2604593   4/1988   France .................... 257/718

*Primary Examiner*—Christopher Atkinson
*Attorney, Agent, or Firm*—Cohen, Pontani, Lieberman & Pavane

[57] ABSTRACT

A spring clip manufactured from a single piece of metal for attaching an electronic component to a heat sink for defining a heat dissipation assembly. The spring clip comprises a main body having a bend with a cantilever on one side of the bend and a mounting region terminating in an engaging edge on the other side of the bend. Outriggers project perpendicularly from both sides of the mounting region and extend beyond the engaging edge In the assembly outriggers project through slots in the heat sink and the electronic component is secured between one side of the heat sink and the engaging edge of the spring clip. The outriggers preferably include retaining members which abut the opposite side of the heat sink thereby resisting rotation of the spring clip relative to the heat sink.

32 Claims, 5 Drawing Sheets

SPRING CLIP FOR ATTACHING AN ELECTRONIC COMPONENT TO A HEAT SINK AND AN ASSEMBLY UTILIZING THE SAME

This application claims the benefit of U.S. provisional application. No. 60/039,179 filed on Feb. 27, 1997.

BACKGROUND OF THE INVENTION

1. Field of the Invention

The present invention is directed to heat sinks and in particular to a spring clip for applying a compressive force between an electronic component and a heat sink.

2. Description of the Related Art

Electronic components secured to circuit boards, as for example power transistors and processors, generate significant amounts of heat which must be dissipated for the components to operate reliably. Some of the heat can be dissipated through the leads of the components. Much of the excess heat, however, is released into the ambient air. It is known in the art that cooling of such electronic components can be improved by thermally coupling the component to a finned or pinned heat sink.

Traditionally, electronic components are mounted to heat sinks by passing bolts through holes defined in the heat sink and the component and securing the bolts with separate nuts. In other configurations, the heat sinks employ tapped holes or threaded fasteners pressed into the heat sink which accommodate separate mounting bolts. In still other arrangements, threaded studs are pressed into the heat sink and the components are mounted thereto using separate nuts.

These conventional arrangements present significant disadvantages. First, mounting holes in electronic components are not typically located in the center of the component and thus, the compressive force imparted to one end of the component by the mounting hardware often causes the opposite end to lift upwards and out of thermal contact with the heat sink. Second, the installation and removal of separate hardware is time consuming and not readily performed automatically using machines, thereby increasing the labor and manufacturing costs. Finally, the trend in the electronic industry has been to eliminate mounting holes in component packages thereby rendering traditional hardware impracticable or obsolete.

In order to overcome these disadvantages several spring clip designs have been developed that mount the component to the heat sink without the use of hardware. For example, the heat sink may be stamped from aluminum with integral clipping mechanisms. Aluminum, however, does not exhibit mechanical properties sufficient to maintain deflection forces over time at increased temperatures and the condition on stamping relatively small sizes limits the applicability of such design.

The size limitation has been overcome by using separate stamped aluminum clips that are riveted to a stamped or extruded heat sink. This alternative configuration, however, does not solve the mechanical problems associated with manufacturing the spring clip using aluminum and requires an additional manufacturing step that increases the overall cost.

It is also known to use stamped steel clips attached to mounting features extruded into a specific heat sink. These clips are made from steel and thus overcome the mechanical problems associated with aluminum but have limited applicability in that the steel clips are only suitable for use with specific heat sinks.

The design of these stamped steel clips has also been modified to include bayonet type retainers which pass through a hole in the heat sink and, in some cases, through a hole in the component. Although not limited to use with specific heat sinks, this spring clip configuration sacrifices spring width for the retention features resulting in relatively large extreme fiber stresses at the union of the bayonet arms to the main body of the spring clip. Thus, such spring clips are limited in the amount of force and range of deflection which may be achieved prior to plastic deformation. Another disadvantage of this particular design is the inability to mount components to opposite surfaces of a heat sink utilizing the same mounting features.

Still other steel clips have been developed having one end which passes into or through a horizontal slot in the heat sink. This configuration overcomes the stress problems associated with bayonet type designs but are prone to excessive rotation under load due to manufacturing and design tolerances, and thus are limited to use with relatively thick walled heat sinks. Moreover, this construction is extremely sensitive to variations in wall thickness and slot tolerances. In addition, the horizontal orientation of the mounting slots impedes the conduction of heat from the device area below the mounting slots to the finned area above the mounting slots thereby increasing the thermal resistance of the heat sink.

SUMMARY OF THE INVENTION

The present inventive spring clip eliminates the need for traditional hardware such as nuts and bolts, may be installed by hand or automatically by machine, imparts a force substantially near the center of an electronic component and thus promotes efficient thermal contact between the heat sink and the component, exhibits mechanical properties that allow a normal force to be maintained over time at increased temperatures, may be deflected over a relatively large range to accommodate a variety of electronic components of different thicknesses such as TO-220, 218, 243, 3P, and may be used with a wide range of stamped and extruded heat sinks without the need for new tooling or significant modification to existing designs.

In a preferred embodiment, the spring clip is manufactured, preferably stamped, from a single piece of metal such as steel. The spring clip comprises a contact region which is adapted to contact the electronic component and translate a spring force to the component when the clip is engaged, a cantilever that extends at an angle from the contact region to a bend, and a mounting region with a substantially flat upper surface terminating in an engaging edge and two outriggers which extend substantially perpendicularly downward from opposite sides of the upper surface. In a preferred embodiment the outriggers include restraining members adapted to secure the clip while in an engaged state.

The spring clip is mounted to a heat sink having two vertically oriented slots defined therein of sufficient size and spacing to receive and retain the outriggers. The relatively small vertically oriented slots minimize the resistance to heat flow in the heat sink better than conventional arrangements. During installation of the spring clip to the heat sink the electronic component is positioned with its thermally conductive rear surface abutting the mounting face of the heat sink and the contact region of the spring clip is aligned at approximately the midsection of the case of the component and the outriggers are aligned with the slots in the heat sink. A force is applied to the cantilever and the bend of the spring clip so that the outriggers pass through the slots in the heat sink and such that the retaining members along with the engagement edge, by virtue of the moment of rotation that results from the spring clips' own force, hold the spring clip against the heat sink. In this arrangement, the engaging edge contacts the mounting face of the heat sink and the substantially vertical orientation of the outriggers substantially prevents the spring clip from rotating during deflection of the spring clip.

In an alternative embodiment of the invention, an electronic component is secured by two spring clips to each side of a single heat sink having two slots. Each slot is of sufficient width to accommodate two outriggers, one from each spring clip, arranged side-by-side. Thus, when the spring clips are inserted into the slots from respective sides of the heat sink the outrigger of one spring clip shares the same slot with the outrigger of a second spring clip.

In another embodiment of the invention, the spring clip includes a guide member disposed across the contact region and bent over the edges of the cantilever towards the outriggers to form a guide member to properly position the electronic component and prevent it from sliding from side-to-side.

In yet another embodiment of the invention, the spring clip is stiffened by a stiffening member, as for example ribs, a gusset or a fold formed in the bend. The stiffening member increases the rigidity of the spring clip and provides greater force for a given deflection.

Accordingly, it is an object of the present invention to provide a spring clip for securing an electronic component to a heat sink without the use of additional hardware such as nuts, bolts or rivets.

Another object of the invention is to provide a spring clip which may be used with heat sinks of different sizes, shapes and thicknesses and does not require the extrusion of special mounting features in the heat sink.

It is a further object of the invention to provide a spring clip which produces higher normal forces, a greater range of deflection to accommodate a variety of electronic component packages over a full range of thickness tolerances and is capable of sustaining a greater stress prior to plastic deformation than spring clips of the prior art.

Still another object of the invention is to provide a spring clip which substantially reduces or prevents excessive rotation under load when used with heat sinks having relatively thin mounting walls.

It is also an object of the invention to provide for back-to-back mounting of electronic components utilizing two spring clips and a single pair of mounting slots.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote similar elements throughout the several views.

DETAILED DESCRIPTION OF THE PRESENTLY PREFERRED EMBODIMENTS

The terms "device", "electronic component", "component", and "electronic component package" are synonymous and used interchangeably throughout the description of the invention.

Figure 1:
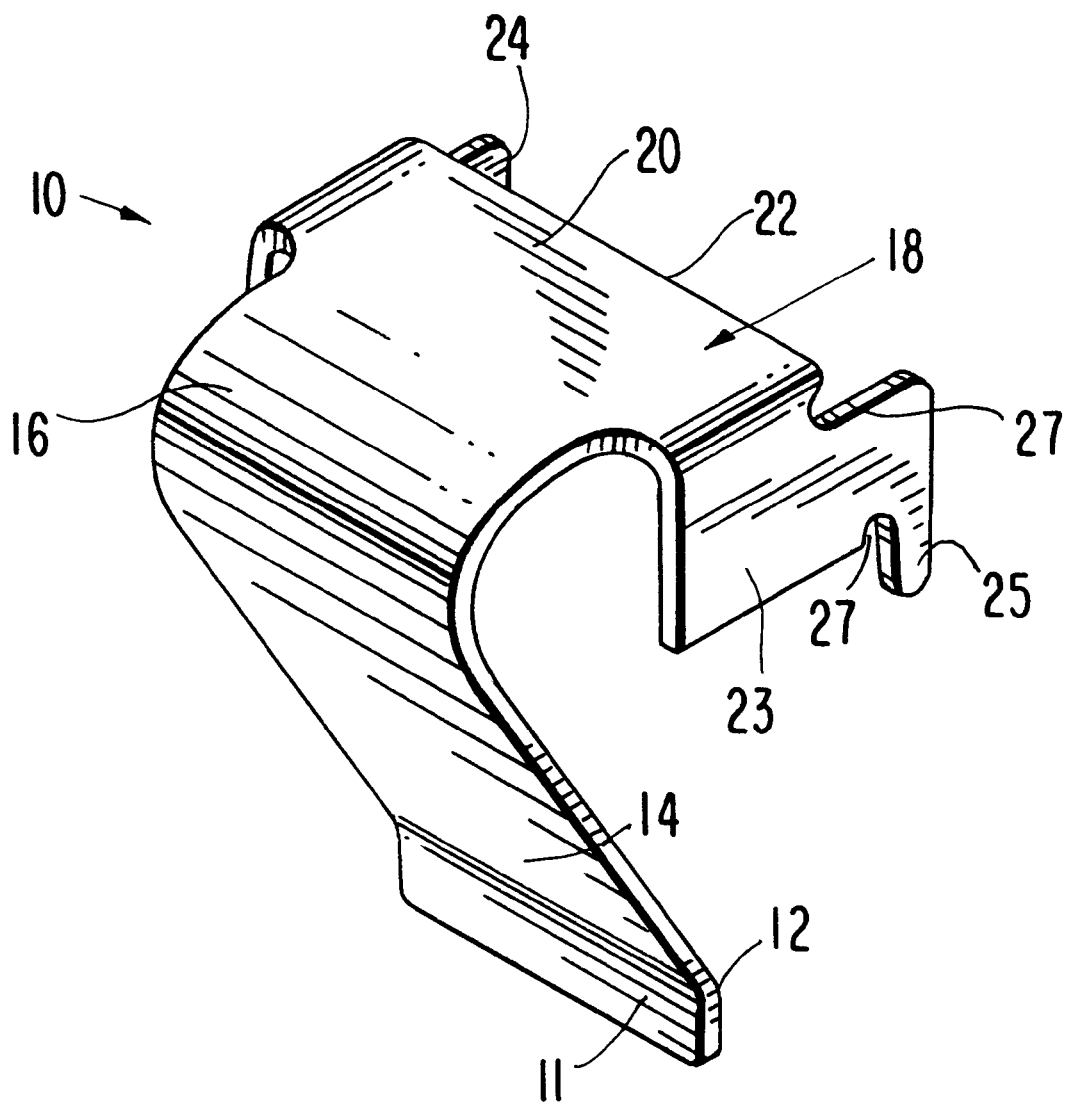
FIG. 1 shows the spring clip in accordance with the present invention.

FIG. 1 shows a spring clip in accordance with the present invention. The spring clip 10 comprises a contact region 12 adapted to contact an electronic component (not shown) and translate a spring force to the electronic component when the spring clip 10 is in an engaged condition. On one side of the contact region 12 the spring clip 10 terminates in a lip 11 and on the opposite side of the contact region 12 a cantilever 14 extends upward to a bend 16. On the opposite side of the bend 16 is a mounting region 18 having a substantially planar upper surface 20 that terminates in an engaging edge 22. Two outriggers 23, 24 project substantially perpendicularly from opposite sides of the upper surface 20 of the mounting region 18 and downwardly towards the contact region 12 and beyond the engaging edge 22. In the preferred embodiment the outriggers 23, 24 include retaining members 25, 26 comprising integral tabs for holding the spring clip in the heat sink (not shown). The spring clip 10 is preferably integrally formed from steel and most preferably made by stamping or punching. As shown in FIG. 1, the spring clip preferably includes notches 27 which aid in manufacturing the spring clip, since in that it is simpler to punch a curved edge than a right angle.

Figure 2:
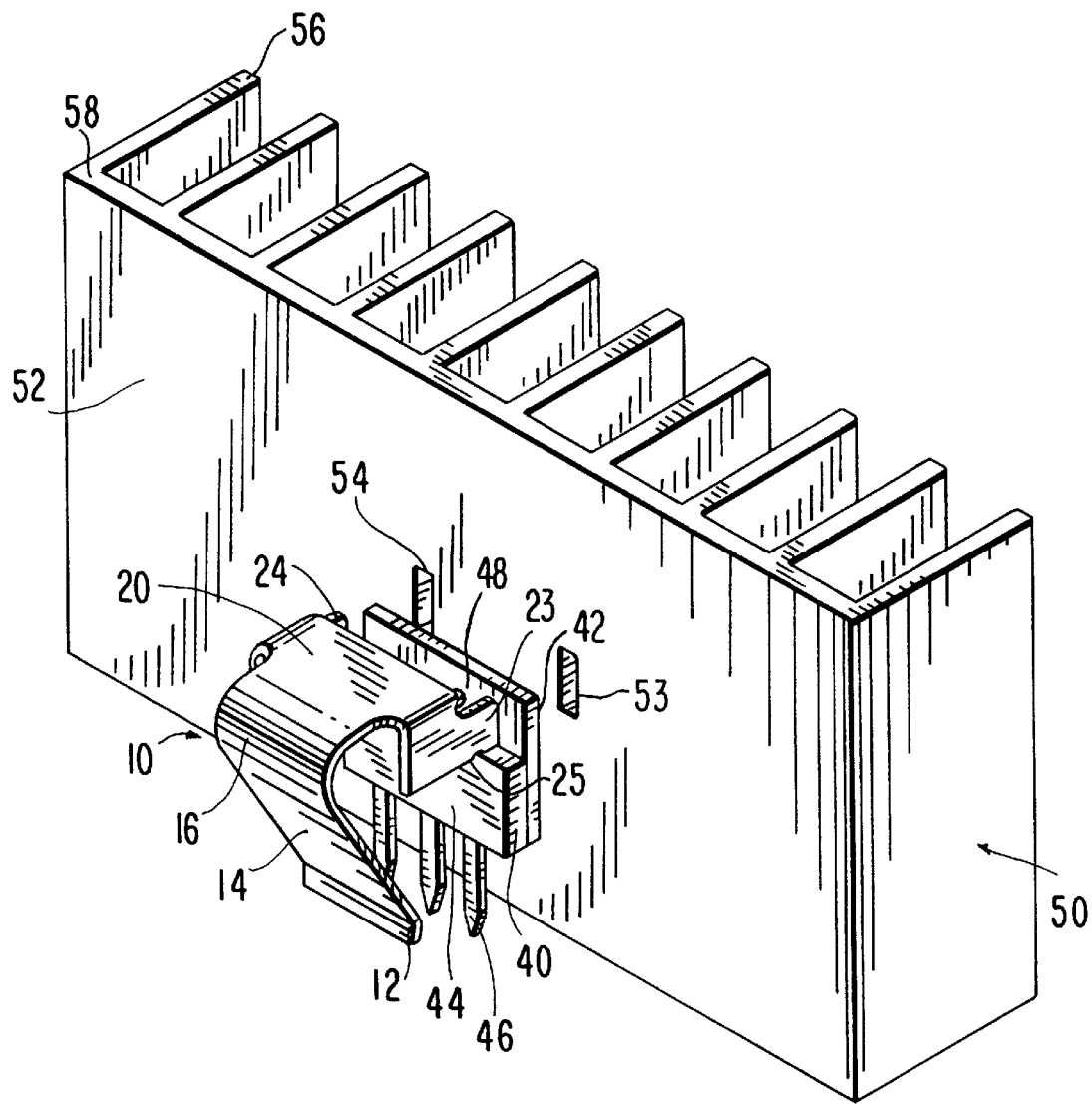
FIG. 2 is an exploded view of a heat dissipation assembly including the spring clip of FIG. 1.
Figure 3:
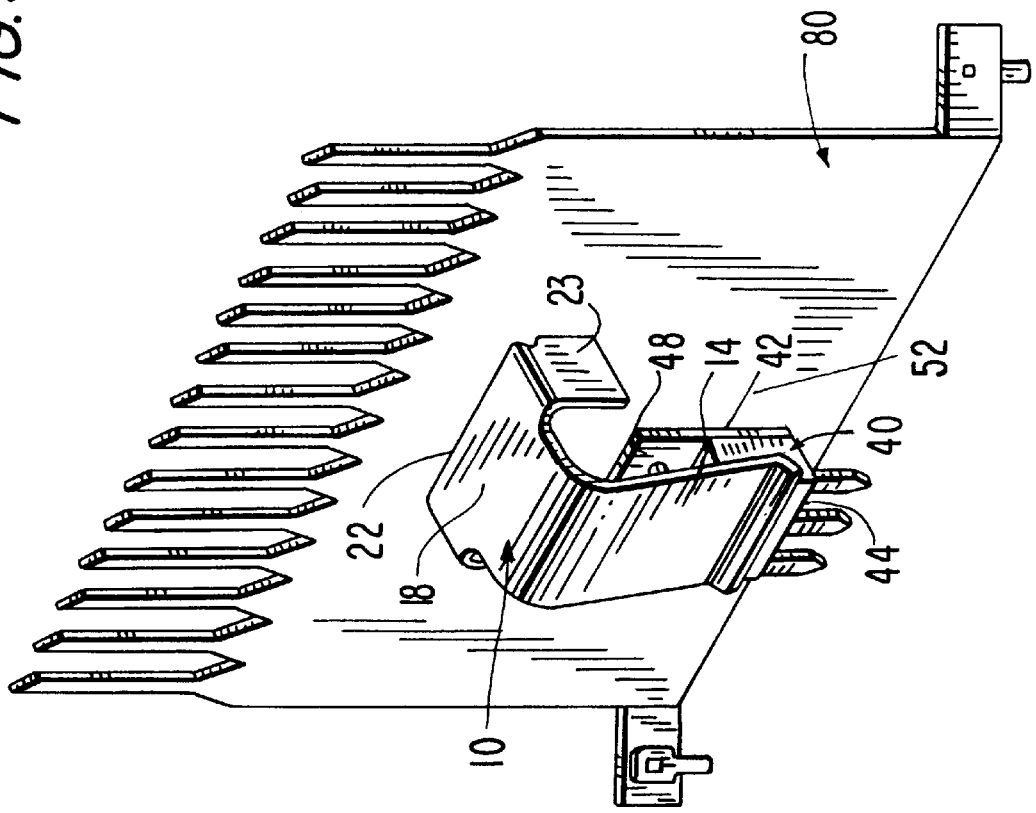
FIG. 3 shows a heat dissipation assembly including the spring clip of FIG. 1 and a heat sink made from a stamped relatively thin sheet of metal.

FIGS. 2 and 3 show an exploded view and an assembled view, respectively, of a heat dissipation assembly including the spring clip 10 mounted to different types of heat sinks 50. As shown, a heat dissipation assembly includes the spring clip 10, an electronic component 40 and a heat sink 50. The heat sink 50 is shown in FIG. 2, for purposes of illustration only, as having fins 56 extending substantially perpendicularly from a base 58, a mounting face 52, an opposite exit face 52' (see FIG. 4) and two vertical slots 53, 54 extending through the heat sink from the mounting face 52 to the exit face 52'. The two slots 53, 54 are of sufficient size to accommodate outriggers 23, 24 such that the outriggers pass through the base 58 and engage the exit face 52'. Electronic component 40 comprises a metal tab 48 having a substantially planar rear surface 42 in thermal contact with the mounting face 52, a case 44 through which the compressive spring force of spring clip 10 is translated by contact region 12, and electronic leads 46 extending from the case 44. The electronic component 40 shown in FIG. 2, by way of illustrative example only, is a JEDEC package style TO-220 transistor, however, the inventive spring clip is suitable for use with other types of packages such as other JEDEC packages of varied thicknesses having a substantially planar mounting surface, including TO-218, TO-247 and TO-3P packages.

The rear surface 42 of the metal tab 48 of the electronic component 40 is positioned in contact with the mounting face 52 of the heat sink 50 such that the electronic component is substantially centered between the two slots 53, 54 and the case 44 is aligned in a substantially vertical direction with the contact region 12 of the spring clip 10. Thereafter, the spring clip 10 is positioned such that the contact region 12 abuts the electronic component 40 and the outriggers 23, 24 are aligned with the slots 53, 54 in the mounting face 52 of the heat sink 50. A force is applied to the cantilever 14 and bend 16 of the spring clip 10 while maintaining an angle defined by the cantilever 14 and the upper surface 20 of the spring clip 10 at less than approximately 90° and the outriggers 23, 24 pass through the slots 53, 54 and are held in place by the retaining members 25, 26. In this assembled state, as shown in FIG. 3, the engaging edge 22 of the mounting region 18 of the spring clip 10 contacts the mounting face 52 of the heat sink 50 and in conjunction with the vertical outriggers 23, 24 act to substantially prevent the spring clip 10 from rotating while the deflection of the cantilever 14 imparts a force to the case 44 of the electronic component 40 for holding the component in thermal contact with the heat sink 50. As shown in FIG. 3, the spring clip in accordance with the invention is also suitable for use with heat sinks manufactured by stamping a relatively thin sheet of metal, such as aluminum or copper.

Figure 4:
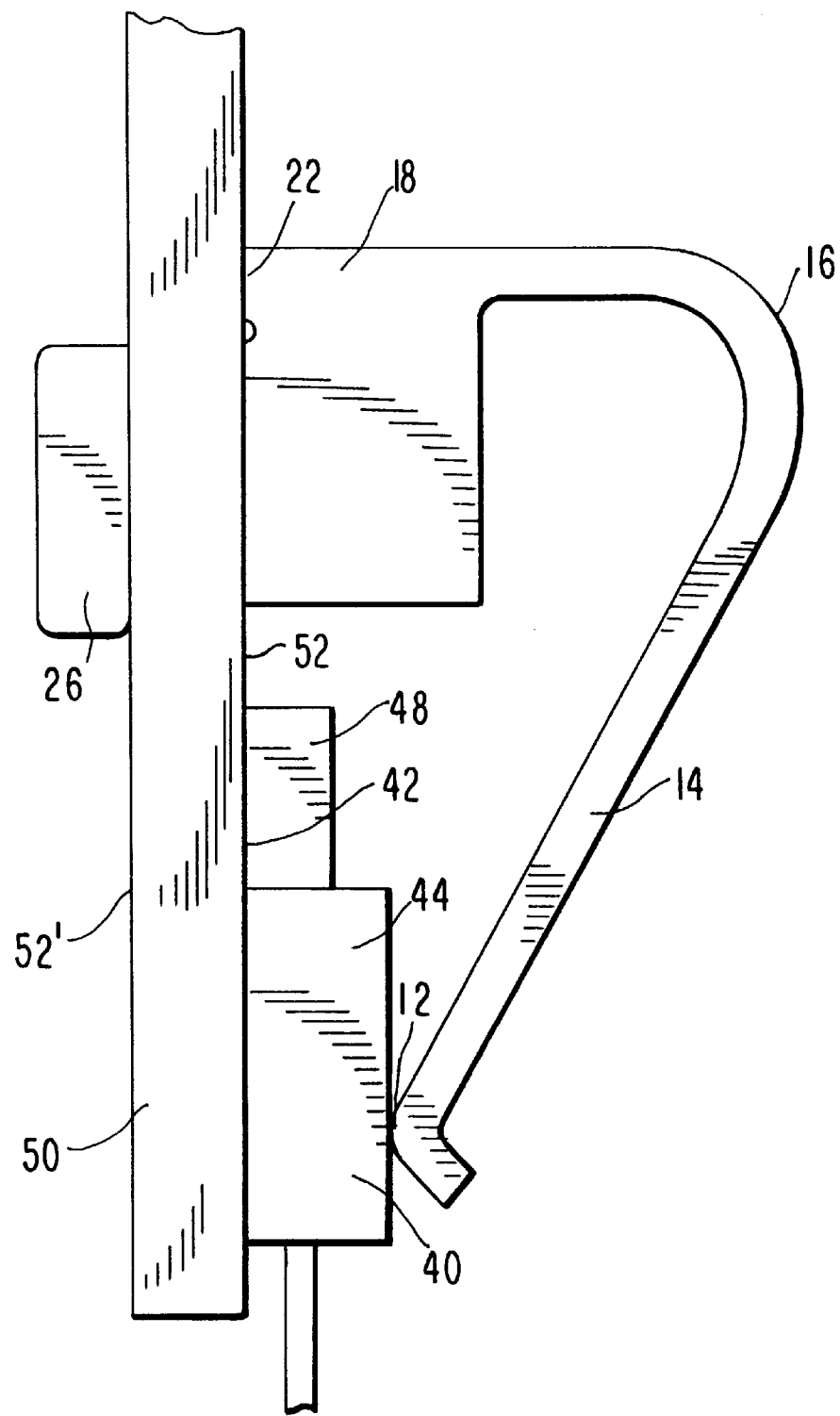
FIG. 4 is a side view of the heat dissipation assembly of FIG. 3.

FIG. 4 is a side view of the spring clip assembly of FIG. 2. When the spring clip 10 is mounted to the heat sink 50 the force applied to the cantilever 14 and bend 16 is translated through the contact region 12 to the case 44 of the electronic component 40. As a result of this force the mounting region 18 is rotated in the direction of the mounting face 52 of the heat sink 50 which, in turn, causes the retaining members 25, 26 to rotate downward towards and back towards the exit face 52'. Rotation of the spring clip 10 toward the heat sink 50 is impeded by the engaging edge 22 abutting the mounting face 52 and the retaining members 25, 26 abutting the exit face 52'. In this assembled state rotation of the spring clip 10 is substantially prevented while the deflected cantilever 14 maintains the electronic component 40 in thermal contact with the heat sink 50. In the preferred embodiment shown in FIG. 4 the retaining members 25, 26 comprise tabs formed integrally with outriggers 23, 24, however, any other known means for retaining the outriggers in the slots 53, 54 is within the intended scope of the invention. In an alternative embodiment, the retaining members may be eliminated and sufficient force for holding the spring clip in the heat sink is provided by tapering the slots 53, 54 sufficiently for establishing a friction fit with outriggers 23, 24.

Figure 5:
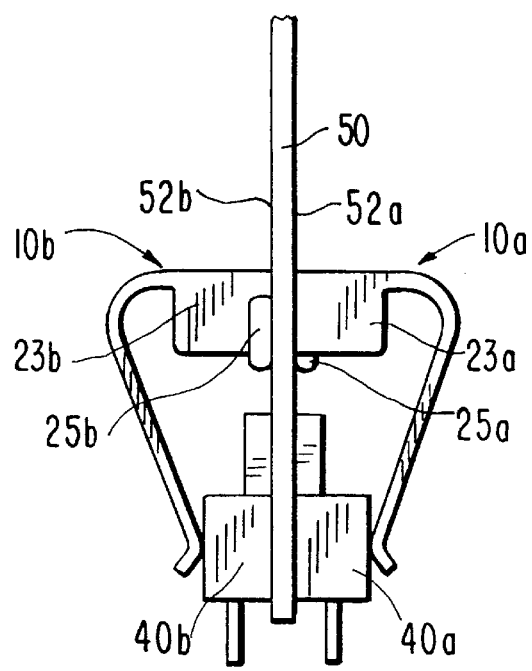
FIG. 5 is a side view of an alternative embodiment of the heat dissipation assembly for mounting two electronic components to a single heat sink using two spring clips.

Another embodiment of the invention in which two electronic components are mounted on opposite sides of a single heat sink using two spring clips is shown in FIG. 5. Electronic components 40*a*, 40*b*, are mounted to opposite mounting faces 52*a*, 52*b* of a heat sink 50 using two spring clips 10*a*, 10*b* each having two outriggers. When assembled, the outrigger 24*a* and the outrigger 23*b* share the same slot while the other two outriggers, not shown in the figure, share the other slot. As will be appreciated, that the slots must be of sufficient width to accommodate two outriggers arranged side-by-side whereby two retaining members, one from each spring clip, can pass through each slot and abut the respective exit face of the heat sink. In a preferred embodiment the width of the outriggers of both spring clips is substantially uniform and thus the center of each spring clip is offset from the midpoint between the two slots by a distance equal to the width of one of the outriggers. Preferably both spring clips are identical.

Figure 6:
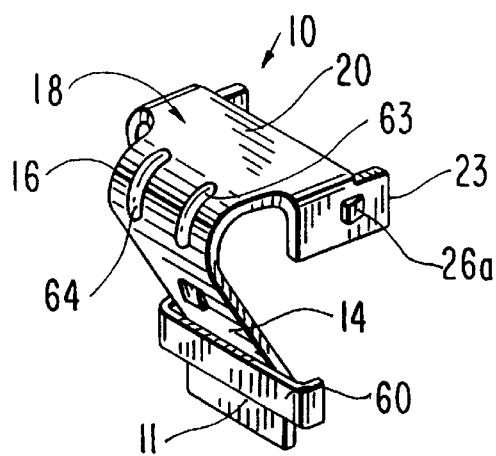
FIG. 6 shows another embodiment of the spring clip in accordance with the invention.

FIG. 6 shows an alternative construction of the spring clip 10 of the invention which is similar to that shown in FIGS. 1 through 4, except for the addition of ribs 62, 63, a guide member 60, a stop member 64 and flaps 25*a*, 26*a*, which replace retaining members 25, 26. As shown, ribs 62, 63 extend across the bend 16 from the upper surface 20 of the mounting region 18 to the cantilever 14 and serve to increase the stiffness of the spring clip 10. The ribs shown in FIG. 6 are, by way of illustrative example only, and it is within the intended scope of the invention to use other configurations of ribs or even other stiffening members such as gussets or folds. Stop member 64 is formed by cutting a section of the cantilever 14 on three sides to form a flap which is then bent toward the outriggers such that the free edge of the stop member contacts the electronic component when the spring clip 10 is in place. Guide member 60 is a separate member bent at its ends towards the outriggers and disposed across the contact region 12 and parts of cantilever 14. The stop member 64 and guide member 60 serve to further insure proper positioning of the electronic component 40 beneath the contact region in the vertical and horizontal directions, respectively. Flaps 25*a*, 26*a* are formed in the outriggers 23, 24 by cutting the metal on three sides and bending the flaps outwardly. Like retaining members 25, 26 in the embodiment of FIGS. 1–4, the flaps are dimensioned so as to pass through the slots in the heat sink during mounting while preventing the spring clip from backing out of the slots after being inserted. In this regard, the flaps 25*a*, 26*a* function as springs which are forced into alignment with outriggers 23, 24 as the outriggers pass through slots 53, 54 and which then spring outward once they clear the slots whereupon the free edges of the flaps engage the exit face of the heat sink.

Figure 7:
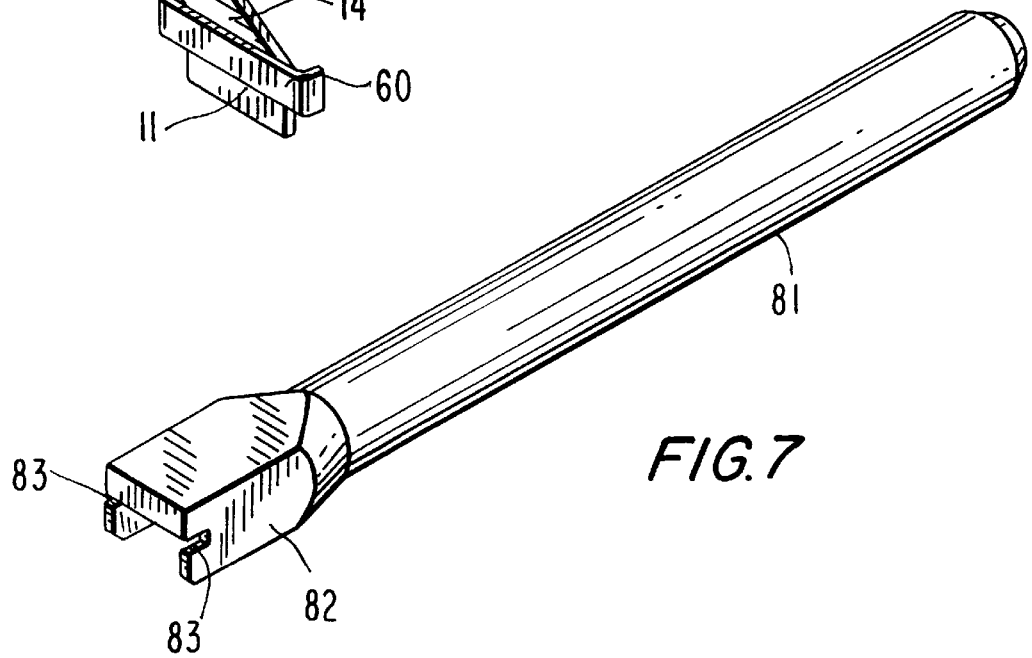
FIG. 7 shows a tool used to install/extract the inventive spring clip in the heat dissipation assembly.

FIG. 7 shows a tool used to manually install or extract the spring clip 10 to the heat sink. However, the spring clip and heat sink may also be assembled automatically by machine or even by hand without the use of the tool. The tool shown in FIG. 7 has a handle 81 connected to a head 82 with two horizontal slits 83 defined therein. During assembly, the spring clip is oriented such that the substantially planar portion of the mounting surface immediately adjacent the outriggers on opposite sides of the bend is aligned with and received by the slits 83. To assemble the spring clip to the heat sink an insertion force is applied to the cantilever 14 and bend 16 in the direction of the heat sink and slightly downward which is greater than or equal to the designed clip normal force in order to deflect the cantilever 14 and push the outriggers into the slots of the heat sink. The spring clip is designed such that once assembled a preload is imposed on the spring clip which results in a moment of rotation about the engaging edge 22 that retains the spring clip to the heat sink by contact between the engaging edge 22 and mounting face 52 on one side of the heat sink and contact between the retaining members 25, 26 and the exit face 52' on the other side of the heat sink. Thus, the spring clip and heat sink will remain assembled irrespective of whether a component is being clamped to the heat sink, how the spring clip is oriented, and the effect of gravitational forces.

The spring clip in accordance with the invention advantageously is adapted to attach an electronic component without the need for additional hardware, may be used with heat sinks of different sizes and shapes, does not require heat sinks with extruded special mounting features, provides a substantial normal clamping force, provides a wide range of deflection, is capable of sustaining greater stress prior to plastic deformation, substantially reduces or prevents excessive rotation under load when used with heat sinks having relatively thin mounting walls, and allows two electronic components to be mounted in a single pair of mounting slots.

Thus, while there have been shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

We claim:

1. A unitary spring clip for securing an electronic component to a heat sink, said heat sink having a mounting face, an exit face and two slots extending through said heat sink from the mounting face to the exit face, said spring clip comprising:

a main body having a bend therein for defining a cantilever on one side of the bend and a mounting region on an opposite side of the bend, the mounting region terminating in an engaging edge, said cantilever providing a directional moment against the mounting face of said heat sink; and a pair of outriggers, each outrigger extending downwardly from one side of said mounting region and extending beyond the engaging edge thereof;

wherein when the spring clip is mounted to said heat sink, said pair of outriggers extend through said slots and the engaging edge of said mounting region abuts the mounting face of said heat sink, said directional moment being applied in a direction to cause securement of said engaging edge within said slots and to cause abutment of said outriggers with the exit face of the heat sink.

2. The spring clip in accordance with claim 1, wherein said main body further comprises a second bend defining said cantilever on one side of the second bend and a lip on an opposite side of the second bend.

3. The spring clip in accordance with claim 1, wherein each outrigger further comprises a retaining member, wherein when said spring clip is mounted to said heat sink the retaining members abut the exit face of said heat sink.

4. The spring clip in accordance with claim 3, wherein each retaining member comprises a tab extending downwardly from its respective outrigger beyond said engaging edge.

5. The spring clip in accordance with claim 3, wherein each retaining member comprises a spring flap defined in its respective outrigger and projecting outwardly therefrom, wherein said spring flaps are forced into alignment with said outriggers as said outriggers are inserted into said slots and said spring flaps abut the exit face of said heat sink when said outriggers are fully inserted.

6. The spring clip in accordance with claim 1, wherein said outriggers are sized relative to the slots so as to be frictionally retained therein.

7. The spring clip in accordance with claim 1, wherein said main body further comprises a stiffening member extending across the first bend from a location in said mounting region to a location in the cantilever to stiffen said spring clip.

8. The spring clip in accordance with claim 1, wherein said stiffening member is selected from the group consisting of a rib, a gusset and a fold.

9. The spring clip in accordance with claim 1, further comprising a guide member having a central section disposed across the second bend and a pair of end sections bent substantially perpendicularly over said main body towards said outriggers to ensure proper horizontal positioning of said electronic component relative to said spring clip.

10. The spring, clip in accordance with claim 9, wherein said cantilever comprises a stop member projecting from the cantilever towards said outriggers to ensure proper vertical positioning of said electronic component relative to said spring clip.

11. The spring clip in accordance with claim 1, wherein said springs clip is a single piece of stamped metal.

12. A heat dissipation assembly for securing an electronic component to a heat sink, comprising:

a heat sink having a mounting face, an exit face and two slots extending through said heat sink from the mounting face to the exit face;

a unitary spring clip mounted to said heat sink, said spring clip comprising:

a main body having a bend therein for defining a cantilever on one side of the bend and a mounting region on an opposite side of the bend, the mounting region terminating in an engaging edge, said cantilever providing a directional moment against the mounting face of said heat sink; and a pair of outriggers, each outrigger extending downwardly from one side of said mounting region and extending beyond the engaging edge thereof;

wherein when the spring clip is mounted to said heat sink, said pair of outriggers extend through said slots and the engaging edge of said mounting region abuts the mounting face of said heat sink, said directional moment being applied in a direction to cause securement of said engaging edge within said slots and to cause abutment of said outriggers with the exit face of the heat sink.

13. The heat dissipation assembly in accordance with claim 12, wherein said main body further comprises a second bend defining said cantilever on one side of the second bend and a lip on an opposite side of the second bend.

14. The heat dissipation assembly in accordance with claim 12, wherein each outrigger further comprises a retaining member, wherein when said spring clip is mounted to said heat sink the retaining members abut the exit face of said heat sink.

15. The heat dissipation assembly in accordance with claim 14, wherein each retaining member comprises a tab extending downwardly from its respective outrigger beyond said engaging edge.

16. The heat dissipation assembly in accordance with claim 14, wherein each retaining member comprises a spring flap defined in its respective outrigger and projecting outwardly therefrom, wherein said spring flaps are forced into alignment with said outriggers as said outriggers are inserted into said slots and said spring flaps abut the exit face of said heat sink when said outriggers are fully inserted.

17. The heat dissipation assembly in accordance with claim 12, wherein said outriggers are sized relative to the slots so as to be frictionally retained therein.

18. The heat dissipation assembly in accordance with claim 12, wherein said main body further comprises a stiffening member extending across the first bend from a location in said mounting region to a location in the cantilever to stiffen said spring clip.

19. The heat dissipation assembly in accordance with claim 12, wherein said stiffening member is selected from the group consisting of a rib, a gusset and a fold.

20. The heat dissipation assembly in accordance with claim 13, further comprising a guide member having a central section disposed across the second bend and a pair of end sections bent substantially perpendicularly over said main body towards said outriggers to ensure proper horizontal positioning of said electronic component relative to said spring clip.

21. The heat dissipation assembly in accordance with claim 20, wherein said cantilever comprises a stop member projecting from the cantilever towards said outriggers to ensure proper vertical positioning of said electronic component relative to said spring clip.

22. The heat dissipation assembly in accordance with claim 12, wherein said spring clip is a single piece of stamped metal.

23. The heat dissipation assembly in accordance with claim 12, further comprising said electronic component, said electronic component being disposed between said engaging edge of said spring clip and said mounting face of said heat sink.

24. A heat dissipation assembly comprising:
  a heat sink having a first side and a second side and two slots extending through said heat sink between said first side and said second side;
  two unitary spring clips, one mounted to each side of the heat sink, each spring clip comprising:
    a main body having a bend therein for defining a cantilever on one side of the bend and a mounting region on an opposite side of the bend, the mounting region terminating in an engaging edge, said cantilever providing a directional moment against one of said first and second sides of said heat sink; and
    a pair of outriggers each outrigger extending downwardly from one side of said mounting region and extending beyond the engaging edge thereof;
  wherein when said spring clips are mounted to said heat sink, said outriggers extend side-by-side through said slots and the engaging edges of said mounting regions of said spring clips abut opposite sides of said heat sink, said directional moment being applied in a direction to cause securement of said engaging edge within said slots and to cause abutment of said outriggers with the other of said first and second sides of the heat sink.

25. The heat dissipation assembly in accordance with claim 24, wherein said main body of each spring clip further comprises a second bend defining said cantilever on one side of the second bend and a lip on an opposite side of the second bend.

26. The heat dissipation assembly in accordance with claim 24, wherein each outrigger further comprises a retaining member, wherein when said spring clips are mounted to said heat sink the retaining members of said spring clips abut opposite sides of said heat sink.

27. The heat dissipation assembly in accordance with claim 26, wherein each retaining member comprises a tab extending downwardly from its respective outrigger beyond said engaging edge.

28. The heat dissipation assembly in accordance with claim 24, wherein said main body further comprises a stiffening member extending across the first bend from a location in said mounting region to a location in the cantilever to stiffen said spring clips.

29. The heat dissipation assembly in accordance with claim 28, wherein said stiffening member is selected from the group consisting of a rib, a gusset and a fold.

30. The heat dissipation assembly in accordance with claim 25, further comprising a guide member having a central section disposed across the second bend and a pair of end sections bent substantially perpendicularly over said main body towards said outriggers to ensure proper horizontal positioning of said electronic components relative to said spring clips.

31. The heat dissipation assembly in accordance with claim 24, wherein each spring clip comprises a single piece of stamped metal.

32. The heat dissipation assembly in accordance with claim 24, further comprising said electronic component, said electronic component being disposed between said engaging edge of said spring clip and said mounting face of said heat sink.

* * * * *